(12) United States Patent
Hellmann

(10) Patent No.: US 10,806,047 B2
(45) Date of Patent: Oct. 13, 2020

(54) ARRANGEMENT OF SUPPORT ELEMENTS OF ELECTRONIC MODULES

(71) Applicant: Phoenix Contact GmbH & Co. KG, Blomberg (DE)

(72) Inventor: Klas Hellmann, Hameln (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 16/469,209

(22) PCT Filed: Dec. 14, 2017

(86) PCT No.: PCT/EP2017/082925
§ 371 (c)(1),
(2) Date: Jun. 13, 2019

(87) PCT Pub. No.: WO2018/109124
PCT Pub. Date: Jun. 21, 2018

(65) Prior Publication Data
US 2019/0394895 A1    Dec. 26, 2019

(30) Foreign Application Priority Data
Dec. 16, 2016   (DE) ...................... 10 2016 124 637

(51) Int. Cl.
*H05K 7/14* (2006.01)
*H01R 13/627* (2006.01)

(52) U.S. Cl.
CPC ....... *H05K 7/1478* (2013.01); *H01R 13/6272* (2013.01); *H05K 7/1468* (2013.01)

(58) Field of Classification Search
CPC ................ H01R 9/2408; H01R 13/514; H01R 13/6272; H05K 7/1478; H05K 7/1468
(Continued)

(56) References Cited

U.S. PATENT DOCUMENTS 2,981,922 A * 4/1961 Van Valkenburg ...... H01R 9/26
439/716
3,824,553 A * 7/1974 Glover ..................... H01R 9/26
439/717
(Continued)

FOREIGN PATENT DOCUMENTS

CN         103701049 A     4/2014
DE         196 48 298 C1   12/1997
(Continued)

OTHER PUBLICATIONS

Pilz GMBH & Co. KG, "PSSuniversal Programmable control systems PSS," System Description No. 21256-EN-04, Jan. 2, 2010 (89 pages).

*Primary Examiner* — Gary F Paumen
(74) *Attorney, Agent, or Firm* — Holland & Hart LLP

(57) ABSTRACT

The present disclosure relates to an arrangement of support elements for holding electronic function modules; having a first support element, wherein the first support element has a top side and a bottom side, wherein a first web receptacle is formed in the top side, and wherein a second web receptacle is formed in the bottom side; and a second support element, wherein the second support element has a first side web and a second side web, wherein the first side web can be inserted into the first web receptacle, and wherein the second side web can be inserted into the second web receptacle.

13 Claims, 4 Drawing Sheets

(58) Field of Classification Search
USPC .................................................. 439/717, 716
See application file for complete search history.

(56) References Cited

U.S. PATENT DOCUMENTS

| | | | | |
|---|---|---|---|---|
| 3,963,296 A * | 6/1976 | Glover | ..................... | H01R 9/26 439/368 |
| 4,322,120 A * | 3/1982 | Rilling | ................. | H01R 12/716 439/631 |
| 4,729,744 A * | 3/1988 | Bet | .......................... | H02B 1/26 439/717 |
| 5,545,060 A * | 8/1996 | Gow | ................... | H01R 9/2408 439/717 |
| 6,322,399 B1 * | 11/2001 | Hanning | .................. | H01R 9/26 439/406 |
| 6,851,985 B2 * | 2/2005 | Lafragette | ................ | H02B 1/26 439/701 |
| 7,753,740 B2 * | 7/2010 | Carolis | ................ | H01R 9/2491 439/717 |
| 8,074,680 B2 * | 12/2011 | De Carolis | ......... | F15B 13/0857 137/560 |
| 8,921,713 B2 * | 12/2014 | Eriksson | .............. | H01H 9/0066 174/541 |
| 9,564,707 B2 * | 2/2017 | Geitner | ................ | H05K 7/1478 |
| 2007/0155221 A1 | 7/2007 | Kathan et al. | | |
| 2009/0023320 A1 | 1/2009 | De Carolis et al. | | |
| 2015/0214657 A1 | 7/2015 | Geitner et al. | | |

FOREIGN PATENT DOCUMENTS

| | | |
|---|---|---|
| DE | 299 16 303 U1 | 2/2001 |
| DE | 202 11 002 U1 | 12/2003 |
| DE | 20310761 U1 | 11/2004 |
| DE | 10 2014 109 984 A1 | 1/2016 |
| EP | 0661915 A1 | 7/1995 |
| EP | 1251595 A1 | 10/2002 |
| EP | 3104237 A1 | 12/2016 |
| JP | S59-168973 U | 9/1984 |
| JP | H 7-200011 A | 8/1995 |
| JP | 2008-267424 A | 11/2008 |
| JP | 2001-57479 A | 2/2011 |
| JP | 2013-74020 A | 4/2013 |
| JP | 2014-230319 A | 12/2014 |

* cited by examiner

ARRANGEMENT OF SUPPORT ELEMENTS OF ELECTRONIC MODULES

CROSS-REFERENCE TO RELATED APPLICATIONS

This application is a 371 national phase filing of International Application No. PCT/EP2017/082925, entitled "ARRANGEMENT OF SUPPORT ELEMENTS OF ELECTRONIC MODULES", filed 14 Dec. 2017, which claims priority to German Patent Application No. 10 2016 124 637.9, entitled "ANORDNUNG VON TRAGELMENTEN", filed 16 Dec. 2016.

BACKGROUND

The present disclosure relates to an arrangement of support elements.

In electronic applications, it often happens that a high number of different functions have to be implemented in one place, and so modular electronic systems are used. When installing modular electronic systems, various electronic function modules that are mechanically and electrically interconnected are used. The electrical connection of the electronic function modules comprises, in particular, plug contacts, electrical cables and/or contact bridges. The mechanical connection of the electronic function modules ensures an effective and direct connection of the electronic function modules. In systems with different electronic function modules, it is often necessary to use very expensive and technically complicated mechanical and electrical connections as compared with individual electronic function modules.

SUMMARY

It is the object underlying the disclosure to ensure effective mechanical and electrical connection between different electronic function modules with little effort.

This object is achieved by modules having features according to the independent claims. Advantageous examples of these features are the subject of the figures, the description and the dependent claims.

According to a first aspect, the object is achieved by an arrangement of support elements for mounting electronic function modules, with a first support element, wherein the first support element has an upper side and a lower side, wherein a first bridge receptacle is formed in the upper side, and wherein a second bridge receptacle is formed in the lower side, and a second support element, wherein the second support element has a first side bridge and a second side bridge, wherein the first side bridge is insertable into the first bridge receptacle, and wherein the second side bridge is insertable into the second bridge receptacle.

This achieves the advantage that a particularly effective and easily provided mechanical connection between the first and second support elements is made possible. Due to the effective mechanical connection between the first and second support elements, the electronic function modules held by the respective support elements can also be effectively mechanically connected to one another.

In conventional electronic devices, high performance electronic function modules, e.g. higher than IP44, are individually mounted in a machine or plant. If several electronic function modules are arranged in close proximity to each other, these are e.g. installed with a corresponding mounting plate to form a unit. The electrical connection of the electronic function modules to the surrounding devices is made, for example, by electrical plug connectors.

In the arrangement according to the present disclosure, the two support elements are effectively mechanically connected to each other by the insertion of the two side bridges in the respective bridge receptacles. By juxtaposing two or more support elements, a sufficiently mechanically stable base may be obtained, on which at least one electronic function module can be held and, together with other electronic function modules, can establish a solid mechanical bond without having to use a mounting plate. Thus, the support elements according to the invention can safely provide an effective mechanical and electrical connection between different electronic function modules with little effort.

In an advantageous example of the arrangement, the first support element and the second support element form a self-supporting arrangement of support elements, in particular a self-supporting and attachable arrangement, and/or the first support element and the second support element can be slidably fastened on a support rail, in particular a top-hat rail.

This achieves the advantage that a self-supporting, in particular a self-supporting and attachable, arrangement of support elements allows an effective and stable attachment of the assembly to a component. By using a top-hat rail, or profile rail, an effective sliding attachment of the interconnected support elements is made possible on the top-hat rail, wherein the top-hat rail is in turn fastened to a component.

In an advantageous example of the arrangement of support elements, the first support element has a support element width, wherein the first support receptacle and the second support receptacle are formed as recesses having a recess width which is smaller than the support element width.

This achieves the advantage that the bridge sections extending over the entire support element width and formed as a recess ensure effective reception of the respective side bridge, wherein a mechanically-stable connection between the support elements can be provided.

In a further advantageous example of the arrangement of support elements, the second support element has an upper side and a lower side, wherein the first side bridge is formed in the upper side of the second support element, or wherein the second side bridge is formed in the lower side of the second support element.

This achieves the advantage that arranging the first and second side bridges on different sides of the second support element ensures effective mechanical attachment between the first and second support elements. The first side bridge formed on the upper side of the second support element and the second side bridge formed on the lower side of the second support element are inserted into the corresponding first and second bridge receptacles of the first support element. In this case, the first and second side bridges act with force on the respective first and second bridge receptacles on both sides, thereby effectively securing the first supporting element to the second supporting element.

In a further advantageous example of the arrangement of support elements, a first side bridge is formed in the upper side of the first support element, which can be inserted into a first bridge receptacle of a further support element, while a second side bridge is formed in the lower side of the first support element, which is insertable in a second bridge receptacle of the further support element.

This achieves the advantage that the first and second side bridges of the first support element allow the first support element to be connected effectively to a further support element. The further support element can also have first and second side bridges, so that a connection of the first support element with a plurality of further support elements is possible, wherein the arrangement of support elements can be extended sufficiently to hold a plurality of electronic function modules.

In a further advantageous example of the arrangement of support elements, a first bridge receptacle for receiving a first side bridge of a third support element is formed in an upper side of the second support element, while a second bridge receptacle for receiving a second side bridge of the third support element is formed in a lower side of the second support element.

This achieves the advantage that the first and second bridge receptacles of the second support element allow the second support element to be connected effectively to a third support element. The third support element can also comprise first and second bridge receptacles so that connection of the third support element to a plurality of additional support elements is possible, wherein the array of support elements can be sufficiently expanded to hold a plurality of electronic function modules.

In a further advantageous example of the arrangement of support elements, a third bridge receptacle is respectively formed in a lower side of the first, second, third and/or further support elements, while the first, second and/or third support elements each have a third side bridge, wherein the third side bridge of the first support element is inserted in the third bridge receptacle of the further support element, while the third side bridge of the second support element is inserted into the third bridge receptacle of the first support element, and/or wherein the third side bridge of the third support element is insertable into the third bridge receptacle of the second support element.

This achieves the advantage that by introducing the first, second and third side bridges into the corresponding first, second and third bridge receptacles, a more stable mechanical fastening of the support elements with each other can be ensured, as when only two side bridges and two bridge receptacles are used.

In a further advantageous example of the arrangement of support elements, the first side bridge and the first bridge receptacle, the second side bridge and the second bridge receptacle, and/or the third side bridge and the third bridge receptacle, are arranged side by side in the first, second and/or third support element.

This achieves the advantage that the juxtaposition of the respective side bridge and the respective bridge receptacle ensures that the respective side bridges and bridge receptacles are arranged on the different support elements at the same height. As a result, the side bridges can be effectively inserted into the corresponding bridge receptacles of a respective adjacent support element.

In a further advantageous example of the arrangement of support elements, the first, second and/or third side bridges can be respectively fastened by a latching connection in the respective first, second and/or third bridge receptacles.

This achieves the advantage that a latching connection ensures effective attachment of the support elements with each other and cannot be released inadvertently.

In a further advantageous example of the arrangement of supporting elements, the first, second and/or third side bridges each have a fastening opening for receiving a fastening element, while the first, second or third bridge receptacles each have a further fastening opening for receiving the fastening element.

This achieves the advantage that a stable attachment of the arrangement of support elements is made possible by receiving the fastener in the mounting holes and in the other mounting holes. In interconnected support elements, the respective mounting holes are at the same height of the corresponding further mounting holes, so that the corresponding mounting element can be effectively received in the respective mounting hole, or further mounting hole.

In a further advantageous example of the arrangement of support elements, the mounting element comprises a screw for connecting the first, second, third and/or further support elements to one another, or comprises a bolt of an electronic function module for fastening the electronic function module to the first, second, third and/or or further support elements.

This achieves the advantage that a screw fastening or a bolt of the various support elements allows attachment of the electronic function module to the corresponding support element. Different mounting holes and various other mounting holes can also be used for attachment of the support elements together, or electronic function modules can be attached to the corresponding support element.

In a further advantageous example of the arrangement of support elements, a first cable receptacle for receiving a first electrical cable and/or a second cable receptacle for receiving a second electrical cable are/is formed in an upper side of the first, second, third and/or further support elements.

This achieves the advantage that the cable receptacles for receiving the respective electrical cables ensure that an effective electrical connection between the electronic function modules is ensured within the arrangement of support elements.

According to a second aspect of the present disclosure, the object is achieved by a component assembly system comprising an assembly of at least a first and a second support element according to the first aspect; a first electrical cable received in a first cable receptacle on an upper side of the at least one first and second support elements; a second electrical cable received in a second cable receptacle on an upper side of the at least one first and second support elements; and at least one first electronic function module for placing on the first and second support elements, wherein the first electronic function module is electrically conductively connected to the first electrical cable and to the second electrical cable.

This achieves the advantage that the component assembly system allows a special compact and easy-to-install arrangement of a number of electronic function modules. Here, the advantageous connection of the support elements ensures that an effective base for placing one or more electronic function modules is ensured. The electronic function modules are thus effectively mechanically fixed and also electrically connected to each other by the electrical cables.

In an advantageous example of the component assembly system, the first electronic function module has a fastening element on a lower side in order to fasten the first electronic function module to the first and second support elements.

This achieves the advantage that an effective positioning and fastening of the first electronic function module to the first and second support elements is ensured by the fastening element, in particular a bolt.

In an advantageous example of the component assembly system, the first and second electrical cables each comprise an insulation layer and at least one electrical conductor, wherein the first electronic function module comprises an electrically-conductive mandrel arrangement to pierce the respective insulation layer and to contact the respective electrical conductor electrically.

This achieves the advantage that placing the first electronic function module on the first and second electrical cables by piercing the respective insulation layer by means of the electrically-conductive mandrel assembly makes an effective electrically-conductive connection between the first and second electrical cables and the first electronic function module.

BRIEF DESCRIPTION OF THE DRAWINGS

Examples of the principles of this disclosure are illustrated in the drawings and will be described in more detail below, wherein.

DETAILED DESCRIPTION

Figure 1:
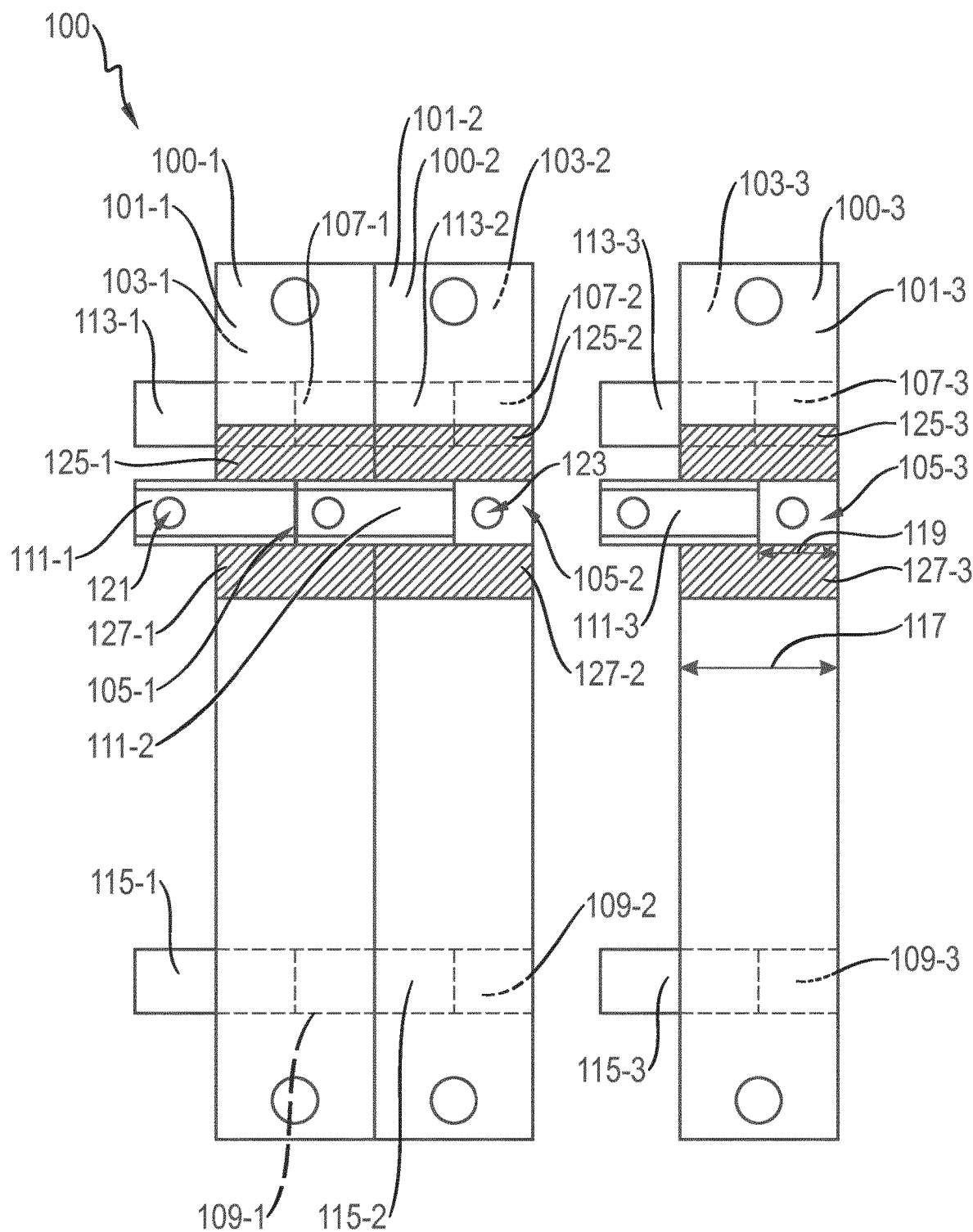
FIG. 1 shows a schematic view of an arrangement of supporting elements according to one example.

FIG. 1 shows a schematic view of an arrangement of support elements according to one example. The arrangement of support elements 100 comprises a first support element 100-1, a second support element 100-2, and a third support element 100-3.

The first, second and third support element 100-1, 100-2 and 100-3 can form a self-supporting, in particular self-supporting and attachable, arrangement, or can be slidably mounted on a mounting rail or profile rail.

The first, second and third support elements 100-1, 100-2 and 100-3 are designed to hold electronic function modules, the electronic function modules, in particular, comprising electronic automation devices. The first, second, and third support elements 100-1, 100-2, and 100-3 can be connected to any number of other support elements 100-x to form a support element assembly that enables the modular construction of different electronic function modules.

The first, second and third support elements 100-1, 100-2 and 100-3 each have an upper side 101-1, 101-2, 101-3 and each have a lower side 103-1, 103-2, 103-3.

A first bridge receptacle 105-1, 105-2, 105-3 is respectively formed on the upper side 101-1, 101-2, 101-3 of the first, second and third support elements 100-1, 100-2, 100-3. A second bridge receptacle 107-1, 107-2, 107-3 is respectively formed on the lower side 103-1, 103-2, 103-3 of the first, second and third support elements 100-1, 100-2, 100-3. Furthermore, a third bridge receptacle 109-1, 109-2, 109-3 is respectively formed on the lower side 103-1, 103-2, 103-3 of the first, second and third support elements 100-1, 100-2, 100-3.

As the second bridge receptacles 107-1, 107-2, 107-3 and third bridge receptacles 109-1, 109-2, 109-3 on the respective lower side 103-1, 103-2, 103-3 of the first, second and third support elements 100-1, 100-2, 100-3 are formed; these are only schematically indicated in FIG. 1.

The first, second, and third support elements 100-1, 100-2, and 100-3 each have a first side bridge 111-1, 111-2, 111-3 on the respective upper side 101-1, 101-2, 101-3. The first side bridge 111-2 of the second support element 100-2 is laterally insertable into the first bridge receptacle 105-1 of the first support element 100-1. The first side bridge 111-3 of the third support element 100-3 is laterally insertable into the first bridge receptacle 105-2 of the second support element 100-2. The first side bridge 111-1 of the first support element 100-1 is laterally insertable into the first bridge receptacle 105-x of a further support element 100-x, is not shown in FIG. 1.

The first, second and third support elements 100-1, 100-2 and 100-3 each have a second side bridge 113-1, 113-2, 113-3 and each have a third side bridge 115-1, 115-2, 115-3.

The second side bridge 113-2 of the second support element 100-2 can be inserted laterally into the second bridge receptacle 107-1 of the first support element 100-1. The second side bridge 113-3 of the third support element 100-3 can be inserted laterally into the second bridge receptacle 107-2 of the second support element 100-2. The second side bridge 113-1 of the first support element 100-1 can be inserted laterally into a second bridge receptacle 107-x of a further support element 100-x, is not shown in FIG. 1.

The third side bridge 115-2 of the second support element 100-2 can be inserted laterally into the third bridge receptacle 109-1 of the first support element 100-1. The third side bridge 115-3 of the third support element 100-3 can be inserted laterally into the third bridge receptacle 109-2 of the second support element 100-2. The third side bridge 113-1 of the first support element 100-1 can be inserted laterally into a third bridge receptacle 109-x of a further support element 100-x, is not shown in FIG. 1.

By inserting the respective side bridges 111-1, 111-2, 111-3, 113-1, 113-2, 113-3, 115-1, 115-2, 115-3 into the corresponding bridge receptacles 105-1, 105-2, 105-3, 105-x, 107-1, 107-2, 107-3, 107-x, 109-1, 109-2, 109-3, 109-x, an effective attachment and thus stable lateral fastening of the first, second, third and further support elements 100-1, 100-2, 100-3, 100-x together can be ensured. This allows the support elements 100-1, 100-2, 100-3, 100-x to form an effective support element assembly, which is either self-supporting or slidably mounted on a profile rail. The attachment of the respective side bridges 111-1, 111-2, 111-3, 113-1, 113-2, 113-3, 115-1, 115-2, 115-3 in the respective bridge receptacles 105-1, 105-2, 105-3, 105-x, 107-1, 107-2, 107-3, 107-x, 109-1, 109-2, 109-3, 109-x can be secured by a snap connection. It is emphasized that both the first support element 100-1, and the third support element 100-3, can each be laterally connected to an arbitrary number of further support elements 100-x, or additional support elements, corresponding to the requirements to form a support element assembly.

In the example illustrated in FIG. 1, the first, second, third, and further support elements 100-1, 100-2, 100-3 respectively have first, second, and third side bridges 111-1, 111-2, 111-3, 113-1, 113-2, 113-3, 115-1, 115-2, 115-3. Nevertheless, it can be sufficient if the first, second, third, or further support elements 100-1, 100-2, 100-3, 100-x have only two side bridges and two bridge receptacles, or alternatively it can also be possible that the first, second, third, or further support elements 100-1, 100-2, 100-3, 100-x have four or more side bridges and four or more bridge receptacles.

As shown in FIG. 1, the first side bridges 111-1, 111-2, 111-3 and the respective first bridge receptacles 105-1, 105-2, 105-3, the second side bridges 113-1, 113-2, 113-3 and the respective second bridge receptacles 107-1, 107-2, 107-3, and the third side bridges 115-1, 115-2, 115-3 and the respective third bridge receptacles 109-1, 109-2, 109-3, are arranged side by side in the respective first, second and third support elements 100-1, 100-2, 100-3.

The first, second and third support elements 100-1, 100-2 and 100-3 each have a support element width 117. The first, second and third bridge receptacles 105-1, 105-2, 105-3, 107-1, 107-2, 107-3, 109-1, 109-2, 109-3 are formed as recesses each having a recess width 119, wherein the recess width 119 is less than the support element width 117.

The first side bridges 111-1, 111-2, 111-3 each have a mounting hole 121, while the first bridge receptacles 105-1, 105-2, 105-3 each have a further mounting hole 123. The first side bridges 111-1, 111-2, 111-3 have an elevated surface, wherein the mounting holes 121 pass through the first side bridges 111-1, 111-2, 111-3. When the first side bridges 111-1, 111-2, 111-3 are inserted into the respective first bridge receptacles 105-1, 105-2, 105-3, the mounting holes 121 and the other mounting holes 123 are positioned one above the other, thus permitting respective reception of a fastener for fixing the first, second and third support elements 100-1, 100-2 and 100-3 together. The fastening element can comprise a screw, wherein the mounting holes 121 and the further mounting holes 123 can comprise a corresponding thread in order to ensure an effective and stable fastening. A bolt can be attached as a fastener to the respective lower sides of the electronic function modules, wherein the bolt can be secured to the mounting holes 121 and the further mounting holes 123 to secure the electronic function modules to the first, second, and third support elements 100-1 100-2 and 100-3.

Although not shown in FIG. 1, the mounting holes 121 and the further mounting holes 123 can alternatively or additionally be attached to the second side bridges 113-1, 113-2, 113-3, 113-*x* and to the second bridge receptacles 107-1, 107-2, 107-3, 107-*x* and/or on the third side bridges 115-1, 115-2, 115-3, 115-*x* and on the third bridge receptacles 109-1, 109-2, 109-3, 101-*x*.

The first, second and third support elements 100-1, 100-2 and 100-3 each have a first cable receptacle 125-1, 125-2, 125-3 for receiving a first electrical cable and each have a second cable receptacle 127-1, 127-2, 127-3 for receiving a second electrical cable. When the first, second, and third support elements 100-1, 100-2, 100-3 are connected together, the first cable receptacles 125-1, 125-2, 125-3 and the second cable receptacles 127-1, 127-2, 127-3 form a continuous receptacle of first and second electric cables on the upper side 101-1, 101-2 and 101-3 of the first, second and third support elements 100-1, 100-2 and 100-3.

Due to the configuration shown in FIG. 1, the first, second, third and further support elements 100-1, 100-2, 100-3 and 100-*x* can advantageously be used within a modular assembly system. Juxtaposing the first, second, third and further support elements 100-1, 100-2, 100-3 and 100-*x* can ensure a stable base on which one or more electronic function modules can be placed and together make it possible to form a solid mechanical connection which can be mounted like a single device. To connect the individual electronic function modules, the first and second electrical cables are used, wherein each is designed, in particular, as a ribbon cable. Thus, the requirements for the degree of protection are ensured, while the electrical supply of the electronic function modules, as well as effective communication between the individual electronic function modules is ensured. A gateway integrated in the system for integrating the modular system into different communication systems, makes it possible to use this in various applications.

Figure 2:
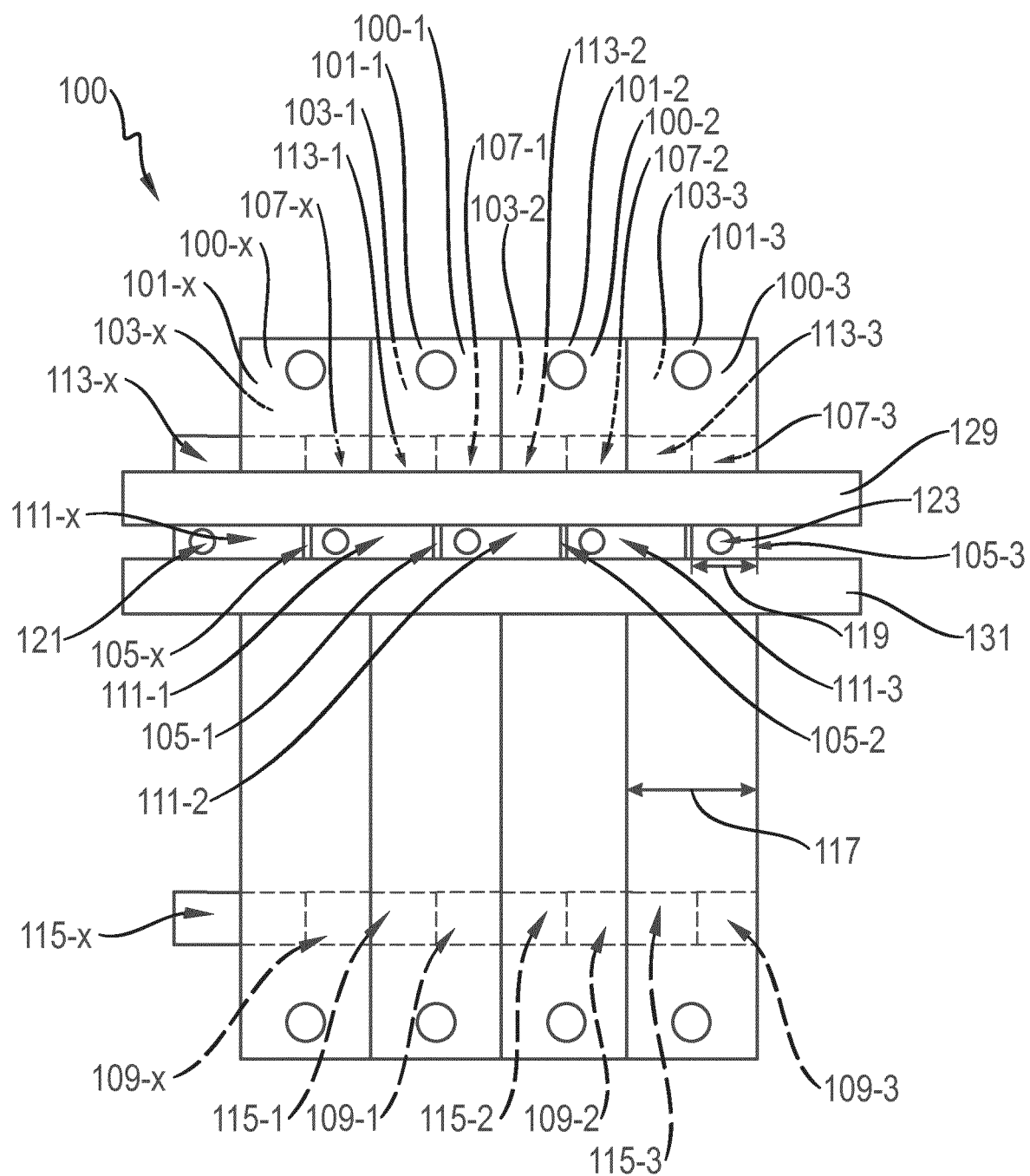
FIG. 2 shows a schematic view of an arrangement of support elements with electrical cables according to a second example.

FIG. 2 shows a schematic view of an arrangement of support elements with electrical cables according to a second example. The arrangement of support elements 100 comprises first, second, third and further support elements 100-1, 100-2, 100-3, 100-*x*, which are interconnected by the insertion of side bridges 111-1, 111-2, 111-3, 111-*x*, 113-1, 113-2, 113-3, 113-*x*, 115-1, 115-2, 115-3, 115-*x* in corresponding bridge receptacles 105-1, 105-2, 105-3, 105-*x*, 107-1, 107-2, 107-3, 107-*x*, 109-1, 109-2, 109-3, 109-*x*. For a detailed description of the first, second, third and further support elements 100-1, 100-2, 100-3, 100-*x*, reference is made to the first example according to FIG. 1.

The first cable receptacles 125-1, 125-2, 125-3 and 125-*x* of the first, second, third and further support elements 100-1, 100-2, 100-3 and 100-*x* are not shown in FIG. 2, since a first electrical cable 129 and a second electrical cable 131 is added in each of these. The first and second electrical cables 129, 131 allow an electrical connection between electronic functional components are not shown in FIG. 2.

Figure 3:
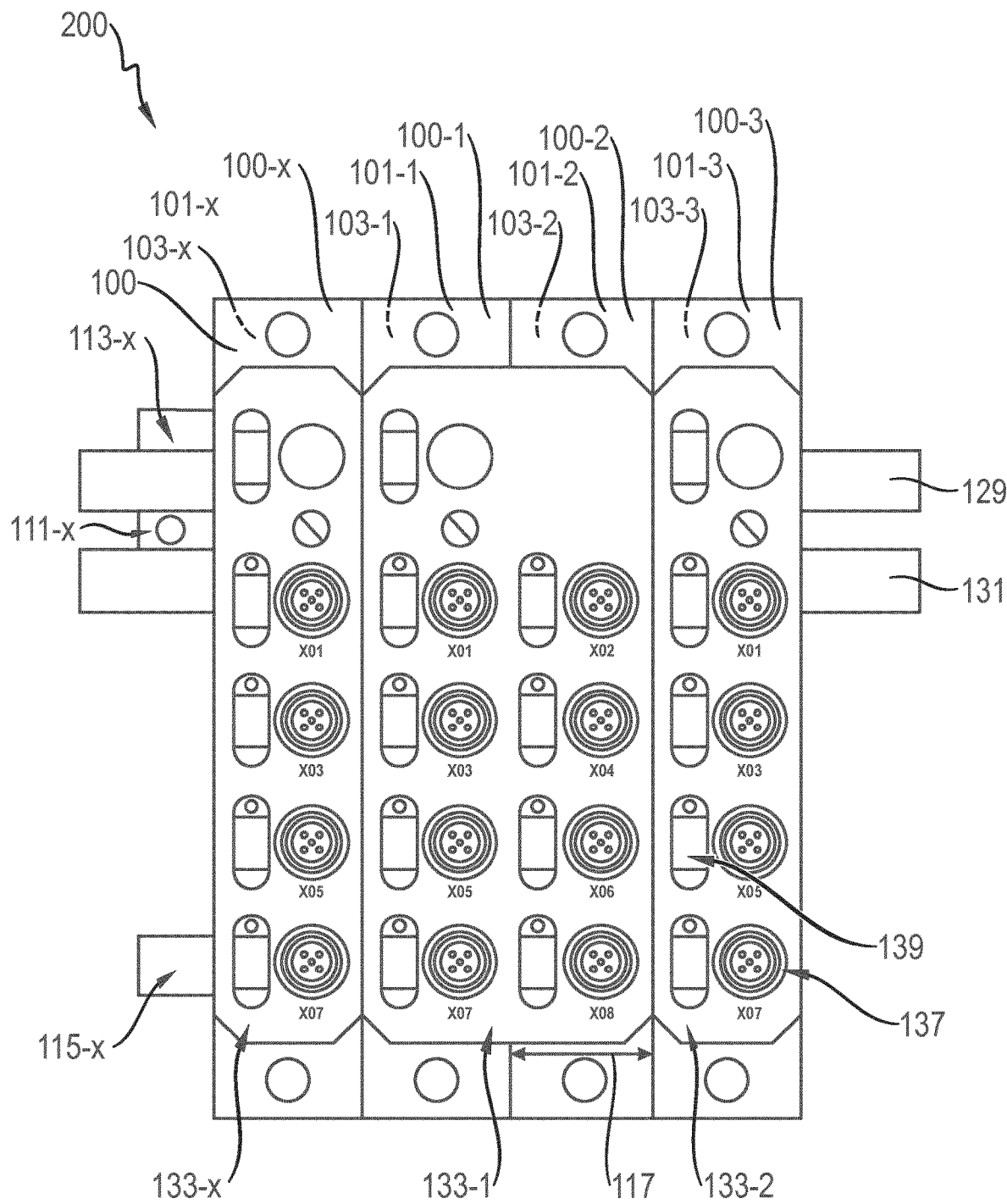
FIG. 3 shows a schematic view of an electronic component assembly system with an arrangement of support elements, electrical cables, and an electronic function module according to a third example.

FIG. 3 shows a schematic view of an electronic component assembly system with an arrangement of support elements, electrical cables and an electronic function module according to a third example. The electronic component assembly system 200 comprises first, second, third, and other support elements 100-1, 100-2, 100-3, 100-*x* connected to each other by inserting side bridges 111-1, 111-2, 111-3, 111-*x*, 113-1, 113-2, 113-3, 113-*x*, 115-1, 115-2, 115-3, 115-*x* in corresponding bridge receptacles 105-1, 105-2, 105-3, 105-*x*, 107-1, 107-2, 107-3, 107-*x*, 109-1, 109-2, 109-3, 109-*x*. For a detailed description of the first, second, third and further support elements 100-1, 100-2, 100-3, 100-*x*, reference is made to the first example according to FIG. 1. Some elements of the first, second, third and further support elements 100-1, 100-2, 100-3, 100-*x* are not shown in FIG. 3.

In addition to the support elements 100-1, 100-2, 100-3, 100-*x*, the electronic component assembly system 200 comprises a first and a second electrical cable 129, 131, as well as a first, second, and further electronic function module 133-1, 133-2, 133-*x*. Here, the first electronic function module 133-1 is about twice as wide as the support element width 117 and is placed on the first and second support elements 100-1, 100-2. Only half of the second electronic function module 133-2 is shown in the view shown in FIG. 3, wherein it is mounted on the third support element 100-3. Only half of the further electronic function module 133-*x* is shown in the view shown in FIG. 3 and is mounted on the further support element 100-*x*. The respective electronic function modules 133-1, 133-2, 133-*x* have a fastening element 135 on the lower side (not shown in FIG. 3), in order to fix the respective electronic function modules 133-1, 133-2, 133-*x* on the corresponding support elements 100-1, 100-2, 100-3, 100-*x*.

A first and second electrical cable 129, 131 is arranged between the support elements 100-1, 100-2, 100-3, 100-*x* and the electronic function modules 133-1, 133-2, 133-*x*, wherein each has an insulation layer and comprises an electrical conductor. The respective electronic function module 133-1, 133-2, 133-*x* comprises an electrically-conductive mandrel arrangement for piercing the respective insulation layer, and for electrically contacting the respective electrical conductor track. As a result, the respective electronic function module 133-1, 133-2, 133-*x* is electrically conductively connected to the first electrical cable 129 and to the second electrical cable 131.

The respective electronic function module 133-1, 133-2, 133-*x* has a plurality of plug connections 137 for connecting the electronic function modules 133-1, 133-2, 133-x to devices to be connected, for example, by cable connections. The respective electronic function module 133-1, 133-2, 133-x also has a multiplicity of labelling elements 139 in order to mark the various plug connections 137.

Figure 4:
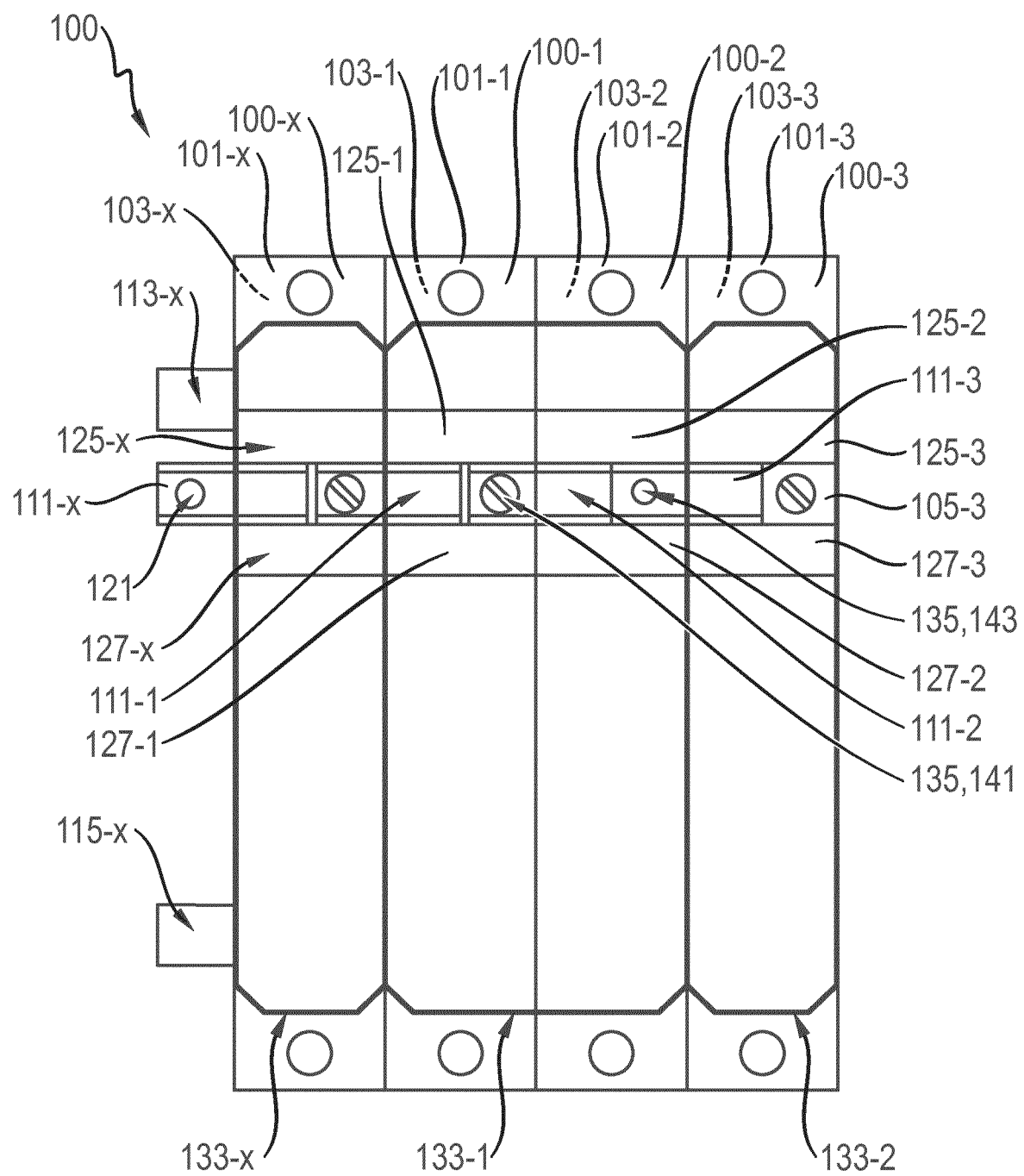
FIG. 4 shows a schematic view of an electronic component assembly system according to the third example.

FIG. 4 shows a schematic view of an electronic component assembly system according to the third example. In FIG. 4, the first and second electrical cables 129, 131 are not shown, and the respective electronic function module 133-1, 133-2, 133-x is shown only schematically by an outline. For a detailed description of the first, second, third and further support elements 100-1, 100-2, 100-3, 100-x, reference is made to the first example according to FIG. 1. Some elements of the first, second, third and further support elements 100-1, 100-2, 100-3, 100-x are not shown in FIG. 4.

FIG. 4 shows the connection of the first, second, third and further support elements 100-1, 100-2, 100-3, 100-x with each other. When the support elements 100-1, 100-2, 100-3, 100-x are connected, a fastener 135, such as e.g. a screw 141, passes through the respective mounting hole 121 of the respective side bridge 111-1, 111-2, 111-3, 111-x, 113-1, 113-2, 113-3, 113-x, 115-1, 115-2, 115-3, 115-x and through the respective further mounting hole 123 of the respective bridge receptacle 105-1, 105-2, 105-3, 105x, 107-1, 107-2, 107-3, 107-x, 109-1, 109-2, 109-3, 109-x in order to interconnect the support elements 100-1, 100-2, 100-3, 100-x. Thus, the fastener 135 enables an effective mechanical connection between the support elements 100-1, 100-2, 100-3, 100-x.

As shown in FIG. 4, instead of a screw 141, the fastening element 135 can also comprise a bolt 143 of the first electronic function module 133-1.

The bolt 143 is formed on a lower side of the first electronic function module 133-1 and allows the first electronic function module 133-1 to be attached to the second support element 100-2. The bolts 143 arranged on the lower side of the second and further electronic function module 133-2, 133-x are not shown in FIG. 4.

LIST OF REFERENCE NUMERALS

100 Arrangement of support elements
100-1 First support element
100-2 Second support element
100-3 Third support element
100-x Further support element
101-1 Upper side of the first support element
101-2 Upper side of the second support element
101-3 Upper side of the third support element
101-x Upper side of the other support element
103-1 Lower side of the first support element
103-2 Lower side of the second support element
103-3 Lower side of the third support element
103-x Lower side of the other support element
105-1 First bridge receptacle of the first support element
105-2 First bridge receptacle of the second support element
105-3 First bridge receptacle of the third support element
105-x First bridge receptacle of another support element
107-1 Second bridge receptacle of the first support element
107-2 Second bridge receptacle of the second support element
107-3 Second bridge receptacle of the third support element
107-x Second bridge receptacle of the further support element
109-1 Third bridge receptacle of the first support element
109-2 Third bridge receptacle of the second support element
109-3 Third bridge receptacle of the third support element
109-x Third bridge receptacle of the further support element
111-1 First side bridge of the first support element
111-2 First side bridge of the second support element
111-3 First side bridge of the third support element
111-x First side bridge of the other support element
113-1 Second side bridge of the first support element
113-2 Second side bridge of the second support element
113-3 Second side bridge of the third support element
113-x Second side bridge of the further support element
115-1 Third side bridge of the first support element
115-2 Third side bridge of the second support element
115-3 Third side bridge of the third support element
115-x Third side bridge of the other support element
117 Support element width
119 Recess width
121 Mounting hole
123 Further mounting hole
125-1 First cable receptacle of the first support element
125-2 First cable receptacle of the second support element
125-3 First cable receptacle of the third support element
125-x First cable receptacle of the other support element
127-1 Second cable receptacle of the first support element
127-2 Second cable receptacle of the second support element
127-3 Second cable receptacle of the third support element
127-x Second cable receptacle of the other support element
129 First electrical cable
131 Second electrical cable
133-1 First electronic function module
133-2 Second electronic function module
133-x Further electronic function module
135 Fastening element
137 Plug connection
139 Labelling element
141 Screw
143 Bolt
200 Component assembly system

What is claimed is:

1. An arrangement of support elements for holding electronic functional modules with:
a plurality of support elements comprising at least a first support element and a second support element, wherein each support element in the plurality of support elements comprises an upper side and a lower side;
wherein a first bridge receptacle of the first support element is formed in the upper side of the first support element, and a second bridge receptacle of the first support element is formed in the lower side of the first support element; wherein a first side bridge of the second support element is configured to be inserted in the first bridge receptacle of the first support element, and wherein a second side bridge of the second support element is configured to be inserted in the second bridge receptacle of the first support element;
wherein each of the first side bridge, the second side bridge, and the third side bridge of one of the first support element, the second support element, or the third support element respectively comprises a mounting hole configured to receive a fastening element;
wherein each of the first bridge receptacle, the second bridge receptacle, and the third bridge receptacle of another one of the first support element, the second support element, or the third support element comprises a further mounting hole configured to receive the corresponding fastening element.

2. The arrangement according to claim 1, wherein the arrangement is self-supporting and configured to slidably fasten to a support rail.

3. The arrangement of support elements according to claim 1, wherein the first support element has a support element width, and the first bridge receptacle of the first support element and the second bridge receptacle of the first support element are formed as recesses with a recess width that is smaller than the first support element width.

4. The arrangement of support elements according to claim 1, wherein a first side bridge of the first support element is formed in the upper side of the first support element and configured to be inserted into a first bridge receptacle of the third support element of the plurality of support elements, and wherein a second side bridge of the first support element is formed in the lower side of the first support element and configured to be inserted into a second bridge receptacle of the third support element.

5. The arrangement of support elements according to claim 4, wherein a first bridge receptacle of the second support element is formed in the upper side of the second support element and configured to receive a first side bridge of a fourth support element of the plurality of support elements, and wherein a second bridge receptacle of the second support element is formed in the lower side of the second support element and configured to receive a second side bridge of the fourth support element.

6. The arrangement of support elements according to claim 5, wherein the lower side of each support element of the plurality of support elements comprises a third bridge receptacle and a third side bridge, and wherein the third side bridge of the first support element is configured to be inserted in the third bridge receptacle of the third support element, wherein the third side bridge of the second support element is configured to be inserted in the third bridge receptacle of the first support element, and the third side bridge of the fourth support element is configured to be inserted in the third bridge receptacle of the second support element.

7. The arrangement of support elements according to claim 6, wherein the first side bridge of one of the first support element, the second support element, or the third support element, is arranged side by side with the first bridge receptacle of another of the first support element, the second support element, or the third support element; or
the second side bridge of one of the first support element; the second support element, or the third element, is arranged side by side with the second bridge receptacle of another of the first support element, the second support element, or the third support element; or
the third side bridge of one of the first support element, the second support element, or the third support element, is arranged side by side with the third bridge receptacle of another of the first support element, the second support element, or the third support element.

8. The arrangement of support elements according to claim 6, wherein the first side bridge, the second side bridge, or the third side bridge of the first support element, the second support element, and the third support element, is configured to fasten to the first bridge receptacle, the second bridge receptacle, or the third bridge receptacle, respectively, of another of the first support element, the second support element, or the third support element by a latching connection.

9. The arrangement of support elements according to claim 1, wherein the fastening element comprises a screw configured to connect to the first support element, the second support element, the third support element, or the fourth support element, or a bolt of an electronic functional module configured to fix the electronic functional module to the first support element, the second support element, the third support element, or the fourth support elements.

10. The arrangement of support elements according to claim 1, wherein the upper side of the first support element, the second support element, the third support element, or the fourth support element comprises a first cable receptacle configured to receive a first electrical cable or a second cable receptacle configured to receive a second electrical cable.

11. A component assembly system comprising:
an assembly of at least a first support element and a second support element; wherein each of the first support element and the second support element comprises an upper side and a lower side, a first bridge receptacle of the first support element is formed in an upper side of the first support element, and a second bridge receptacle of the first support element is formed in the lower side of the first support element, a first side bridge of the second support element is configured to be inserted in the first bridge receptacle of the first support element, and a second side bridge of the second support element is configured to be inserted in the second bridge receptacle of the first support element;
a first electrical cable received in a first cable receptacle of the first support element on the upper side of the first support element and in a first cable receptacle of the second support element on the upper side of the second support element;
a second electrical cable received in a second cable receptacle of the first support element on an upper surface of the first support element a second cable receptacle of the second support element on an upper surface of the second support element; and
at least a first electronic functional module configured to mount (133-1) for mounting on the first support element and the second support element, wherein the first electronic functional module is electrically connected with the first electrical cable and with the second electrical cable.

12. The component assembly system according to claim 11, wherein the first electronic functional module comprises a fastening element on a lower side of the first electronic functional module to attach the first electronic function module to the first support element and the second support element.

13. The component assembly system according to claim 11, wherein each of the first electrical cable and the second electrical cable comprises an insulation layer and at least one electrical conductor track.

* * * * *